(12) United States Patent
Li et al.

(10) Patent No.: US 11,982,891 B2
(45) Date of Patent: May 14, 2024

(54) CURVED DISPLAY MODULE AND CURVED DISPLAY DEVICE

(71) Applicants: Beijing BOE Display Technology Co., Ltd., Beijing (CN); BOE Technology Group Co., Ltd., Beijing (CN)

(72) Inventors: Huiyan Li, Beijing (CN); Bochang Wang, Beijing (CN); Yu Zhang, Beijing (CN); Shixin Geng, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/923,186

(22) PCT Filed: May 12, 2021

(86) PCT No.: PCT/CN2021/093328
§ 371 (c)(1),
(2) Date: Nov. 3, 2022

(87) PCT Pub. No.: WO2021/249093
PCT Pub. Date: Dec. 16, 2021

(65) Prior Publication Data
US 2023/0185122 A1 Jun. 15, 2023

(30) Foreign Application Priority Data
Jun. 11, 2020 (CN) .......................... 202010529401.1

(51) Int. Cl.
*G02F 1/1333* (2006.01)
*H05K 1/18* (2006.01)

(52) U.S. Cl.
CPC .... *G02F 1/13332* (2021.01); *G02F 1/133314* (2021.01); *G02F 1/133317* (2021.01);
(Continued)

(58) Field of Classification Search
CPC .. G02F 1/133; G02F 1/1333; G02F 1/133305; G02F 1/133308;
(Continued)

(56) References Cited

U.S. PATENT DOCUMENTS 10,139,662 B2 11/2018 Lee et al.
10,197,833 B2 2/2019 Kim et al.
(Continued)

FOREIGN PATENT DOCUMENTS

CN 101276080 A 10/2008
CN 202548470 U 11/2012
(Continued)

OTHER PUBLICATIONS

Patent Translate CN 102866591 (Jan. 9, 2013).*
(Continued)

*Primary Examiner* — Thoi V Duong
(74) *Attorney, Agent, or Firm* — IPro, PLLC

(57) ABSTRACT

A curved display module and a curved display device. The curved display module can be bent along a long-side direction, and comprises a display panel (1), a backlight module (2), a front frame (3), a back plate (4), an XPCB (6), and an FPC (5); the FPC (5) is provided at a first long-side edge of the display panel (1) and is configured to connect the binding region of the first long-side edge of the display panel (1) to the XPCB (6); the first long-side edge of the back plate (4) is in the shape of staircase, and comprises a back surface (41), a slope surface (42), and a step surface (43) that are sequentially connected from the direction distant from the first long-side edge to the direction close to the first long-side edge.

14 Claims, 14 Drawing Sheets

(52) U.S. Cl.
CPC ....... *G02F 1/133325* (2021.01); *H05K 1/189* (2013.01); *H05K 2201/10136* (2013.01)

(58) Field of Classification Search
CPC ......... G02F 1/133311; G02F 1/133314; G02F 1/133317; G02F 1/13332; G02F 1/133328; G02F 1/133325; G02F 1/13452; G09G 3/36; H05K 1/147; H05K 1/189; H05K 2201/10136
See application file for complete search history.

(56) References Cited

U.S. PATENT DOCUMENTS

| | | | |
|---|---|---|---|
| 2005/0057703 A1* | 3/2005 | Tsubokura | G02F 1/13394 349/58 |
| 2005/0264712 A1* | 12/2005 | Kim | G02F 1/133308 349/58 |
| 2012/0050637 A1 | 3/2012 | Harada et al. | |
| 2013/0329162 A1 | 12/2013 | Fujii et al. | |
| 2015/0248858 A1 | 9/2015 | Ahn | |
| 2015/0316810 A1* | 11/2015 | Shibahara | G02F 1/13452 349/150 |
| 2016/0187709 A1 | 6/2016 | Lee et al. | |
| 2017/0006726 A1 | 1/2017 | Li et al. | |
| 2018/0157091 A1 | 6/2018 | Lee et al. | |
| 2018/0275447 A1 | 9/2018 | Kawashima | |
| 2020/0015356 A1 | 1/2020 | Park et al. | |
| 2020/0225530 A1 | 7/2020 | Do et al. | |

FOREIGN PATENT DOCUMENTS

| | | | | |
|---|---|---|---|---|
| CN | 102866519 | * | 1/2013 | ............... G02F 1/13 |
| CN | 103489371 | A | 1/2014 | |
| CN | 104380365 | A | 2/2015 | |
| CN | 204392729 | U | 6/2015 | |
| CN | 104882070 | A | 9/2015 | |
| CN | 105009187 | A | 10/2015 | |
| CN | 105223711 | A | 1/2016 | |
| CN | 105445985 | A | 3/2016 | |
| CN | 105739146 | A | 7/2016 | |
| CN | 105807514 | A | 7/2016 | |
| CN | 108153015 | A | 6/2018 | |
| CN | 207676075 | U | 7/2018 | |
| CN | 108628019 | A | 10/2018 | |
| CN | 109254434 | A | 1/2019 | |
| CN | 209356801 | U | 9/2019 | |
| CN | 110687705 | A | 1/2020 | |
| CN | 110933347 | A | 3/2020 | |
| IN | 110007495 | A | 7/2019 | |
| JP | 10792454 | A | 4/1995 | |

OTHER PUBLICATIONS

CN202010529401.1 first office action.
CN202010529401.1 second office action.
CN202010529401.1 Decision of Rejection.
PCT/CN2021/093328 international search report.

* cited by examiner

A1-A2

B1-B2

D1-D2

E1-E2

CURVED DISPLAY MODULE AND CURVED DISPLAY DEVICE

CROSS REFERENCE TO RELATED APPLICATIONS

The present application is a National Stage of International Application No. PCT/CN2021/093328, filed on May 12, 2021, which claims priority to the Chinese Patent Application No. 202010529401.1, filed to China National Intellectual Property Administration on Jun. 11, 2020, which are hereby incorporated by reference in their entireties.

FIELD

The present application relates to the technical field of curved display, in particular to a curved display module and a curved display device.

BACKGROUND

At present, traditional display modules are flat display architectures, with the development of display technology and the pursuit of innovative display effects, it is necessary to consider diversified module display forms, and curved display is more in line with an ergonomic design, and can present a more realistic perspective of the display effect. For curved display, the control for curvature of a display module (OC) has a critical impact on the performance of the module and a final display effect.

There are few control solutions for curvature of large-size curved OCs, and there is no clear technical architecture or solution. The only patent CN107813136A (OLED CURVED TV PRODUCTION PROCESS) for a curved measurement jig only introduces an assembly process of a curved TV in general, and does not explain how to control OC curvature. However, the control for curvature of the OCs directly affects the function and display effect of the modules, effective control for curvature of the OC (curvature of a panel, curvature of a COF and curvature of an XPCB) is especially important for module quality control. Therefore, the present patent focuses on a control design architecture and solution for the curvature of the large-size curved OCs.

SUMMARY

The present application discloses a curved display module and a curved display device, and aims to provide a module design architecture that can improve a control effect for the curvature of the curved display module.

A curved display module is capable of being bent in a long-side direction, and includes a display panel, a backlight module, a front frame, a back plate, an XPCB, and an FPC; and the front frame and the back plate are matched to assemble the display panel and the backlight module, wherein the FPC is at a first long-side edge of the display panel and is configured to connect a bonding region of the first long-side edge of the display panel to the XPCB; a first long-side edge of the back plate is in a shape of staircase, and includes a back surface, a slope surface, and a step surface which are sequentially connected in a direction from a position away from the first long-side edge to a position close to the first long-side edge; and the XPCB is on the step surface of the back plate, and includes at least two sub XPCBs arranged in an extension direction of a first long side and independent from each other, and each of the sub XPCBs extends along the first long side, and is fixed to the back plate by means of a connection member which is independent.

In some embodiments, the connection member includes snap fasteners and screws; the snap fasteners are configured to connect the sub XPCB to the back plate; and the screws are configured to lock the sub XPCB to the back plate.

In some embodiments, each of the sub XPCBs is connected to the back plate by a plurality of snap fasteners, and the plurality of snap fasteners are arranged sequentially in an extension direction of the sub XPCB.

In some embodiment, each of the sub XPCBs is connected to the bonding region of the display panel by a plurality of FPCs, and the plurality of snap fasteners are disposed among the plurality of FPCs at intervals.

In some embodiments, two ends of each of the sub XPCBs are locked to the step surface of the back plate by the screws.

In some embodiments, a first bayonet is disposed in the step surface of the back plate; and each of the snap fasteners include a clamping portion and a snap portion; the clamping portion is a semi-closed or open frame structure and configured to clamp and limit the sub XPCB; and the snap portion is connected to the clamping portion and configured to be snapped in the first bayonet of the step surface of the back plate.

In some embodiments, the snap portion is a claw hook type snap or a round table type snap.

In some embodiments, the snap fasteners includes a clamping portions and a double-sided adhesive tapes; the clamping portions are is a semi-closed or open frame structures and configured to clamp and limit the sub XPCBs; and the double-sided adhesive tapes are is disposed on a side surfaces of the clamping portions facing away from the sub XPCBs and configured to stick to the step surface of the back plate.

In some embodiments, the curved display module further includes cover plates in one-to-one correspondence with the sub XPCBs, wherein each of the cover plates is in a strip shape matched with a shape of the sub XPCB, configured to cover the sub XPCB corresponding thereto, and fixedly connected to the back plate.

In some embodiments, the front frame includes a front bezel and a side bezel, and the side bezel wraps around an outer side of a folded edge of the back plate and is fixedly connected to the folded edge of the back plate; and a second bayonet is disposed on a section of the side bezel disposed along the first long side of the display panel; and a hook portion is disposed on a side edge of each of the cover plates close to the side bezel, and the hook portion is clamped with the second bayonet on the side bezel.

In some embodiments, a first locking nail portion is disposed on a side edge of each of the cover plates away from the side bezel, disposed on the slope surface of the back plate and connected to the slope surface by a screw.

In some embodiments, second locking nail portions are disposed at two ends of each of the cover plates, disposed on the step surface of the back plate and connected to the step surface by screws; and second locking nail holes formed in the second locking nail portions are waist-shaped holes extending in the extension direction of the first long side.

In some embodiments, each of the sub XPCBs has a third locking nail hole corresponding to each of the second locking nail holes in position; the third locking nail hole is a waist-shaped hole extending in the extension direction of the first long side; and the screw connecting the second locking nail portion to the step surface of the back plate penetrate through the third locking nail hole.

In some embodiments, each of the cover plate include a plurality of hook portions and a plurality of first locking nail portions; the plurality of hook portions are sequentially arranged along the side edge of the cover plate close to the side bezel; and the plurality of first locking nail portions are sequentially arranged along the side edge of the cover plate away from the side bezel.

In some embodiments, the XPCB includes two sub XPCBs, and the curved display module includes two cover plates in one-to-one correspondence with the two sub XPCBs.

In some embodiments, the curved display module further includes an upper adhesive frame, and the upper adhesive frame includes a longitudinal frame configured to limit side edges of the display panel and a bearing portion extending inward relative to the longitudinal frame and configured to bear a back edge of the display panel; the front frame includes a front bezel and a side bezel, and the front bezel is configured to limit a front edge of the display panel; and the curved display module further includes a first foam between the front bezel and the front edge of the display panel, a second foam between the bearing portion of the upper adhesive frame and the back edge of the display panel, and a silicone pad between the longitudinal frame of the upper adhesive frame and the side edges of the display panel.

A curved display device includes the curved display module as described according to any one of the above.

DETAILED DESCRIPTION OF THE EMBODIMENTS

In a curved module project, a final LCD module (OC) must be presented in a curved form to meet a need for a curved surface of a product. Direct manufacturing of curved display panels (panel), flexible printed circuits (FPC) and printed circuit boards (XPCB) to match the needs of curved surfaces requires very high research and development costs, and as a new thing, a research and development schedule, yield, production capacity, etc. are not controllable, so a project development risk is extremely high. If flat LCD modules (OC) are applied to curved modules, especially large-size vehicle-mounted curved modules with high reliability needs, a problem of the control for curvature of OC-related subcomponents and credibility and reliability problems thereof must be properly solved.

The present application discloses a curved display module and a curved display device, and aims to provide a module design architecture that can improve a control effect for curvature of the curved display module.

Technical solutions of embodiments of the present application will be described clearly and completely in combination with the accompanying drawings of the embodiments of the present application. Apparently, the described embodiments are some, but not all, embodiments of the present application. Based on the embodiments in the present application, all other embodiments obtained by those ordinarily skilled in the art without making creative work belong to the protection scope of the present application.

Figure 5:
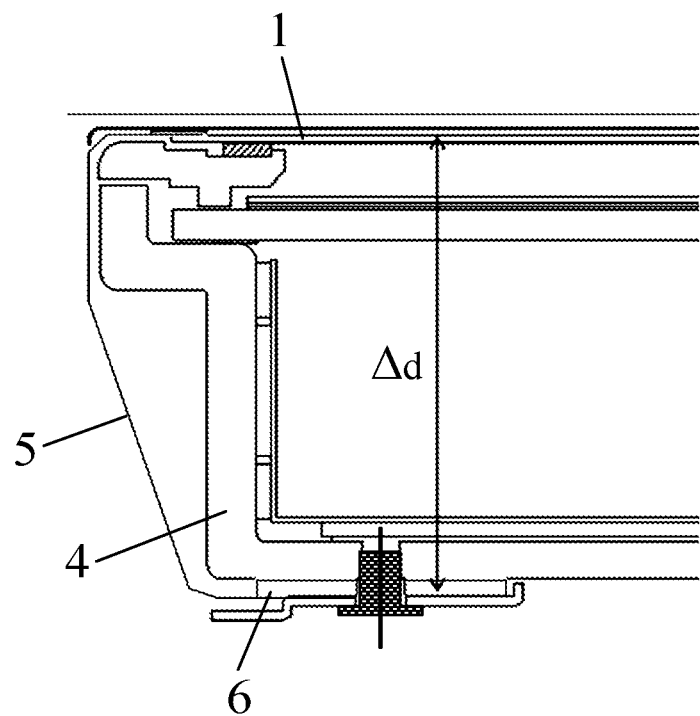
FIG. 5 is a schematic diagram of a partial cross-sectional structure of a curved display module at a first long side in the related art.
Figure 6:
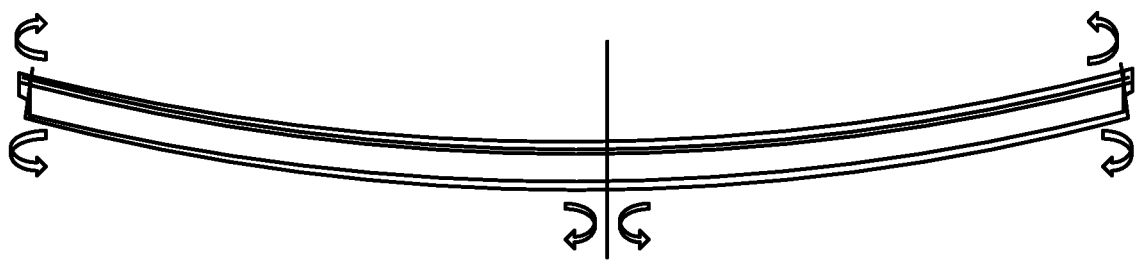
FIG. 6 is a schematic diagram of a state structure of an XPCB generating rebonded stress after being bent in the curved display module shown in FIG. 5.
Figure 7:
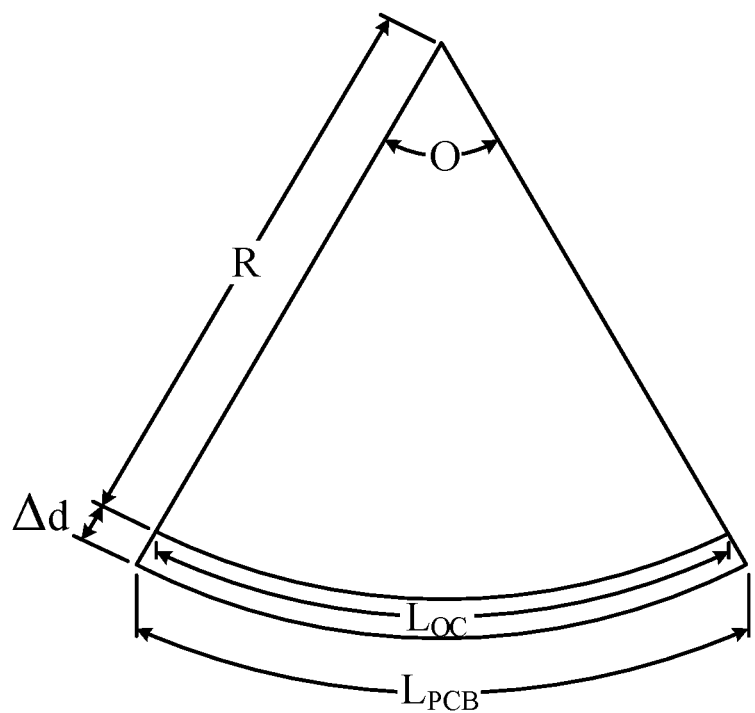
FIG. 7 is a principle analysis schematic diagram when an FPC connected to an XPCB and a panel bears shear force in a bent state of a module.

Please refer to FIG. 1 to FIG. 24. FIG. 1, FIG. 2, FIG. 9, and FIG. 15 are schematic diagrams of an overall structure of a curved display module provided by an embodiment of the present application. FIG. 5, FIG. 6, and FIG. 7 are used to analyze a stress state of an XPCB and an FPC in a bent state of a curved display module in the related art. Other accompanying drawings are partially enlarged or cross-sectional diagrams of a curved display module provided by an embodiment of the present application. It should be noted that the accompanying drawings in the present application mainly reflect the general position, form, and connection method, etc. of each structure, and there is no limitation on the size, and proportion, etc. of each structure.

Specifically, in the embodiment of the present application, in description of a range of values, words such as "about", "approximately", "roughly", etc., represent a range of values based on a central value. For example, specifically, 5% is added or subtracted based on the central value. Exemplarily, "about 0.8 mm" indicates that a range of the value may be "0.76 mm-0.84 mm".

Figure 1:
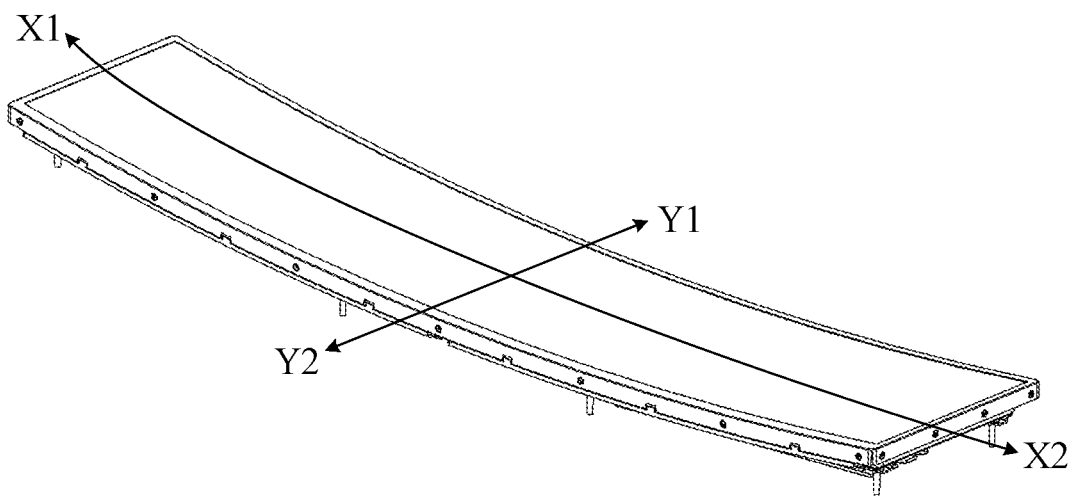
FIG. 1 is a schematic diagram of a dimensional structure of a curved display module provided by an embodiment of the present application.

For example, the embodiment of the present application provides a curved display module, as shown in FIG. 1, which is square and has two opposite long sides and two opposite short sides. The curved display module can be bent in a long-side direction (X-X direction in FIG. 1).

Specifically, the curved display module provided in the embodiment of the present application is placed horizontally in practical applications, i.e., in the two long sides, one long side faces the ground (ground side), the other long side faces the sky (sky side), and the two short sides are located on left and right sides. Furthermore, in the present application, the "first long side" refers to a long side configured for FPC bonding connection. The curved display module is suitable for medium or large curved display products, especially for large curved display projects, such as a display product with 1.2 m long. Specifically, the curved display module may be used for vehicle-mounted curved display devices or curved TVs, monitors, etc.

Figure 2:
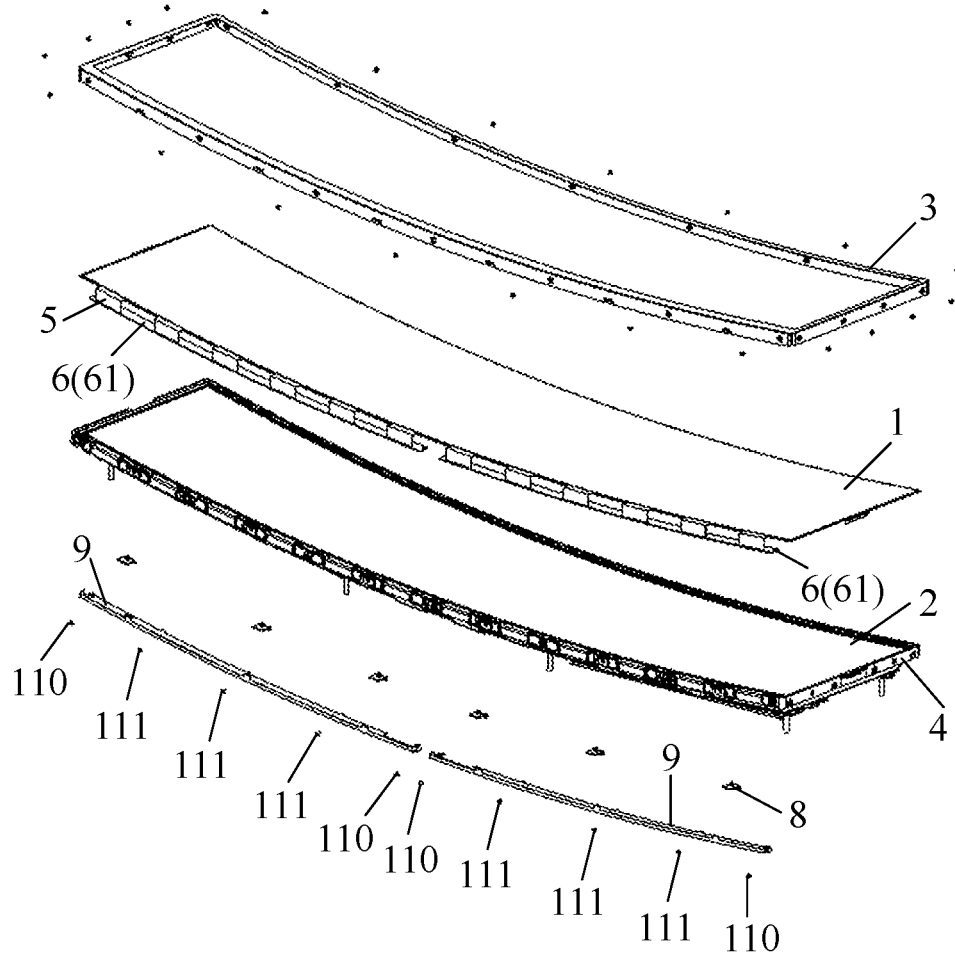
FIG. 2 is a schematic diagram of an exploded structure of a curved display module provided by an embodiment of the present application.

Specifically, as shown in FIG. 2, the curved display module includes a display panel 1, a backlight module 2, a front frame 3, a back plate 4, an XPCB 6, and an FPC 5; the front frame 3 is matched with the back plate 4 to assemble the display panel 1 and the backlight module 2; and the FPC 5 is disposed at a first long-side edge of the display panel 1 and is configured to connect a bonding region of the first long-side edge of the display panel 1 to the XPCB 6.

Figure 3:
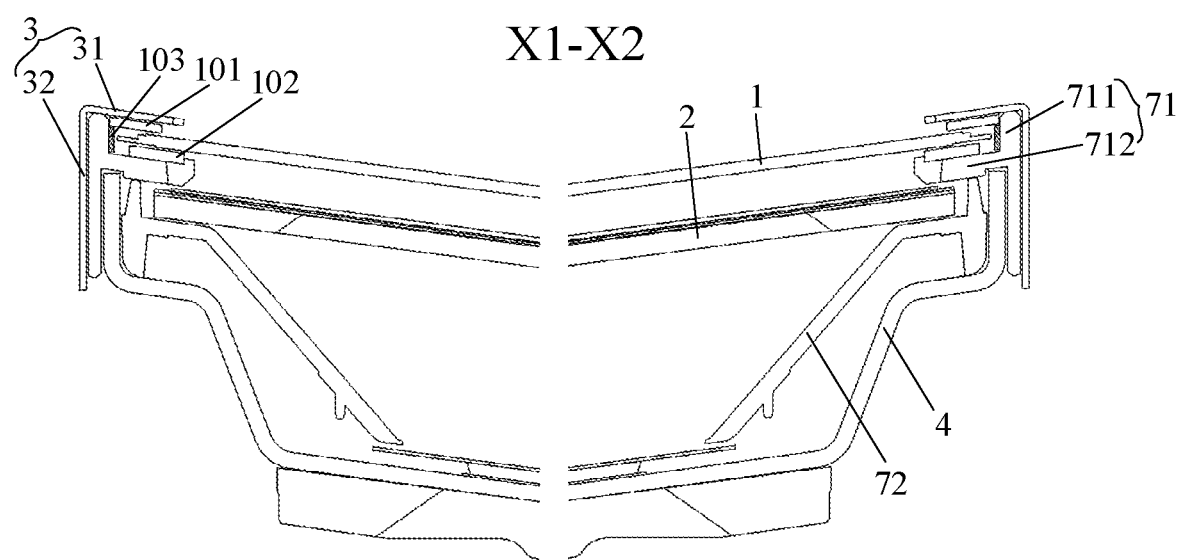
FIG. 3 is a schematic diagram of a partial cross-sectional structure of two ends of a curved display module in an X1-X2 direction in FIG. 1 provided by an embodiment of the present application.
Figure 4:
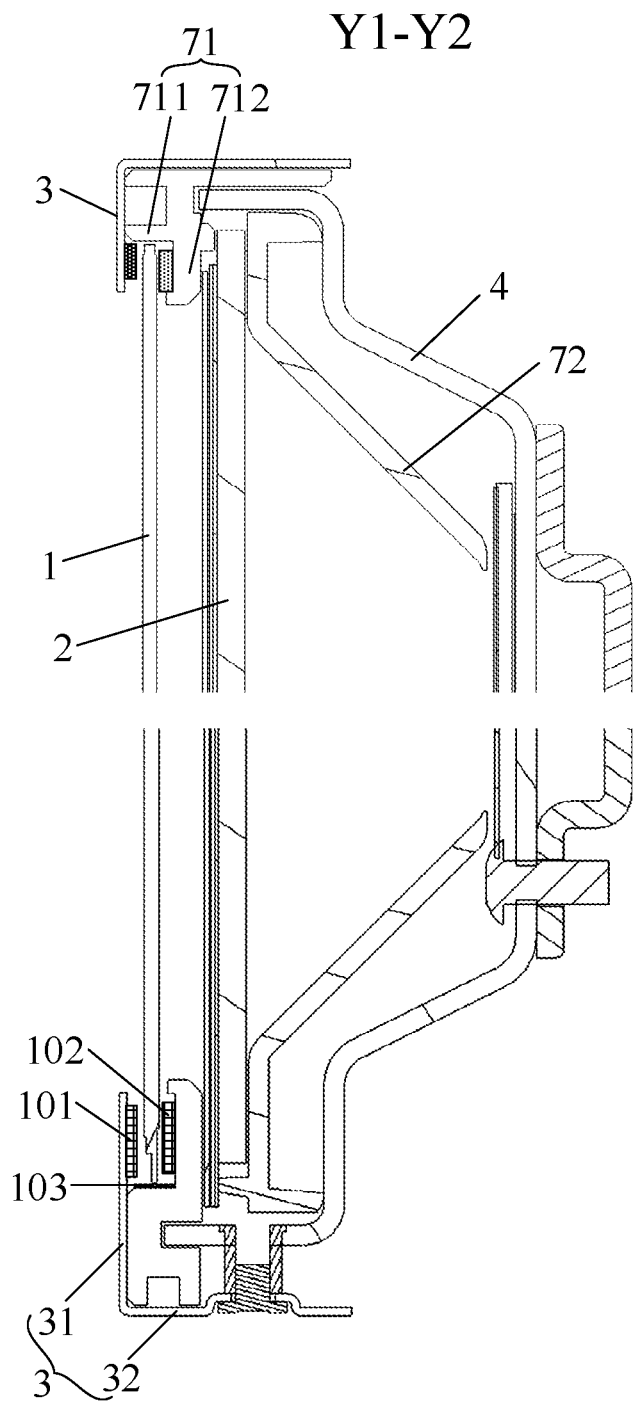
FIG. 4 is a schematic diagram of a partial cross-sectional structure of two ends of a curved display module in a Y1-Y2 direction in FIG. 1 provided by an embodiment of the present application.

For example, as shown in FIG. 3 and FIG. 4, the front frame 3 and the back plate 4 of the curved display module are matched to form an assembly shell, and the curved display module includes an upper adhesive frame 71 and a lower adhesive frame 72 located in the assembly shell. The upper adhesive frame 71 includes a longitudinal frame 711 configured to limit side edges of the display panel 1, and a bearing portion 712 extending inward relative to the longitudinal frame 711 and configured to bear a back edge of the display panel 1. The display panel 1 is located on a front side of the bearing portion 712. The backlight module 2 is located on a rear side of the bearing portion 712. The lower adhesive frame 72 is configured to be disposed between the backlight module 2 and the back plate 4.

As shown in FIG. 3 and FIG. 4, the back edge of the display panel 1 is placed on the bearing portion 712 of the upper adhesive frame 71, and the longitudinal frame 711 of the upper adhesive frame 71 limits the side edges of the display panel 1; the front frame 3 includes a front bezel 31 and a side bezel 32, and the front bezel 31 limits the front edge of the display panel 1; and thus, the control for curvature of the display panel (Panel) 1 and the backlight module 2 can be achieved by the limitation of the front frame 3, the back plate 4, the upper adhesive frame 71 and the lower adhesive frame 72.

Exemplarily, the front frame 3 and the back plate 4 may be of metal.

In some embodiments, as shown in FIG. 3 and FIG. 4, the curved display module further includes a first foam 101 located between the front bezel 31 and the front edge of the display panel 1, a second foam 102 located between the bearing portion 712 of the upper adhesive frame 71 and the back edge of the display panel 1, and a silicone pad 103 located between the longitudinal frame 711 of the upper adhesive frame 71 and the side edges of the display panel 1.

The first foam 101 and the second foam 102 are mainly for sealing to prevent foreign objects from entering the module, and the silicone pad 103 mainly plays a cushioning role to avoid problems such as screen shattering due to vibration or force.

Exemplarily, the first foam 101 sticks to an inner side surface (one side towards the panel) of the front bezel 31 of the front frame 3, and a thickness thereof may be about 0.8 mm. The second foam 102 sticks to one side of the bearing portion 712 of the upper adhesive frame 71 facing the back surface of the display panel 1, and a thickness of the second foam 102 may be about 1.1 mm. The first foam 101 and the second foam 102 may be disposed around the display panel 1.

Exemplarily, the silicone pad 103 may be disposed on the longitudinal frame 711 on the left and right sides and the ground side of the upper adhesive frame 71. Specifically, the silicone pad 103 is attached to the inner side surface (one side toward the panel) of the longitudinal frame 711. For example, the thickness of the silicone pad 103 attached to the longitudinal frame 711 on the left and right sides (such as two sides in an X-X direction in FIG. 1) may be about 0.45 mm, and the thickness of the silicone pad 103 attached to the longitudinal frame 711 on the ground side (such as one side in the Y-Y direction and facing the ground in FIG. 1) may be about 0.3 mm.

Exemplarily, as shown in FIG. 4, a gap between a lower surface of the first foam 101 and the panel 1 may be about 0.4 mm. A gap between left and right side surfaces of the panel 1 and the silicone pad 103 on the left and right sides is about 0.32 mm, and a gap between the left and right side surfaces of the panel 1 and the longitudinal frame 711 on the left and right sides is about 0.77 mm. The ground side of the panel 1 is supported on the silicone pad 103 roughly 0.3 mm thick, and a gap between the sky side surface of the panel 1 and the longitudinal frame 711 is about 0.4 mm.

Specifically, through settings of the above silicone pad 103, the first foam 101 and the second foam 102, as well as the structural gap design, it may be avoided that in a vehicle driving process, the panel 1 hits the upper adhesive frame 71 and the front frame 3 and is damaged, and it may also be avoided that the foreign objects enter the module and cause abnormal pictures.

Specifically, in a process of bending the display module into a curved surface, the FPC will be subjected to shear force and has the risk of tearing by force.

In the following description, a theoretical analysis of factors influencing a bending force of the FPC is carried out by means of geometric simulation. FIG. 5 is a schematic diagram of a partial cross section of a curved display module in a width direction (such as a Y-Y direction in FIG. 1) in the related art. As shown in FIG. 5, the XPCB 6 is fixed on the back surface of the back plate 4, one side of the FPC 5 is located on a TFT layer on one side of the panel 1 and bonded and connected with the panel 1, the other side of the FPC 5 is located on the side of the XPCB 6 and bonded and connected with the XPCB 6, and the strip-shaped XPCB 6 is forcibly locked on the back surface of the curved back plate 4 by screws. As shown in FIG. 6, the XPCB 6 forcibly bent will always keep a kind of re-bonded stress, and meanwhile, the FPC bonded with the XPCB 6 will also be subject to shear force.

Specifically, span demands for the FPC on the panel side and the XPCB side after module bending are different. As shown in FIG. 7, a module bending curvature radius is set as R, a distance from the FPC on the panel side to the FPC on the XPCB side on the back surface of the back plate is $\Delta d$, and a span of the FPC on the left and right ends of the XPCB (two ends in a bent direction of the module) is L.

A total span of the FPC on the panel side is $L_{OC} = 2\pi \cdot R \cdot \theta / 360°$.

A total span of the FPC on the XPCB side is $L_{PCB} = 2\pi \cdot (R+\Delta d) \cdot \theta / 360°$.

A total span difference of the FPC on the panel side and the XPCB side is $\Delta L = L_{PCB} - L_{OC} = 2\pi \cdot (R+\Delta d) \cdot \theta / 360° - 2\pi \cdot R \cdot \theta / 360° = 2\pi \cdot \Delta d \cdot \theta / 360°$, where $\theta$ is a bending arc angle corresponding to the total span of the FPC on the XPCB side, and $\theta = \{L_{PCB} / [2\pi \cdot (R+\Delta d)]\} \cdot 360°$.

Thus, $\Delta L = 2\pi \cdot \Delta d \cdot \theta / 360° = 2\pi \cdot \Delta d \cdot \{L_{PCB} / [2\pi \cdot (R+\Delta d)]\} \cdot 360° / 360° = \Delta d \cdot L_{PCB} / (R+\Delta d)$.

From calculation results, the total span difference of the FPC on the XPCB side and the panel side needs to be widened by $\Delta L$ to meet the demand of module structure bending, but $L_{OC} = L_{PCB}$ under a conventional planar form, i.e., the total span of the FPC on the actual panel side and the XPCB side is equal and fixed, so the FPC is prone to tearing after module bending and assembly, and the larger $\Delta d$ value and $\theta$ value (i.e., the larger L PCB) are, the larger $\Delta L$ is, and the greater the risk of FPC tearing after assembly is.

Figure 8:
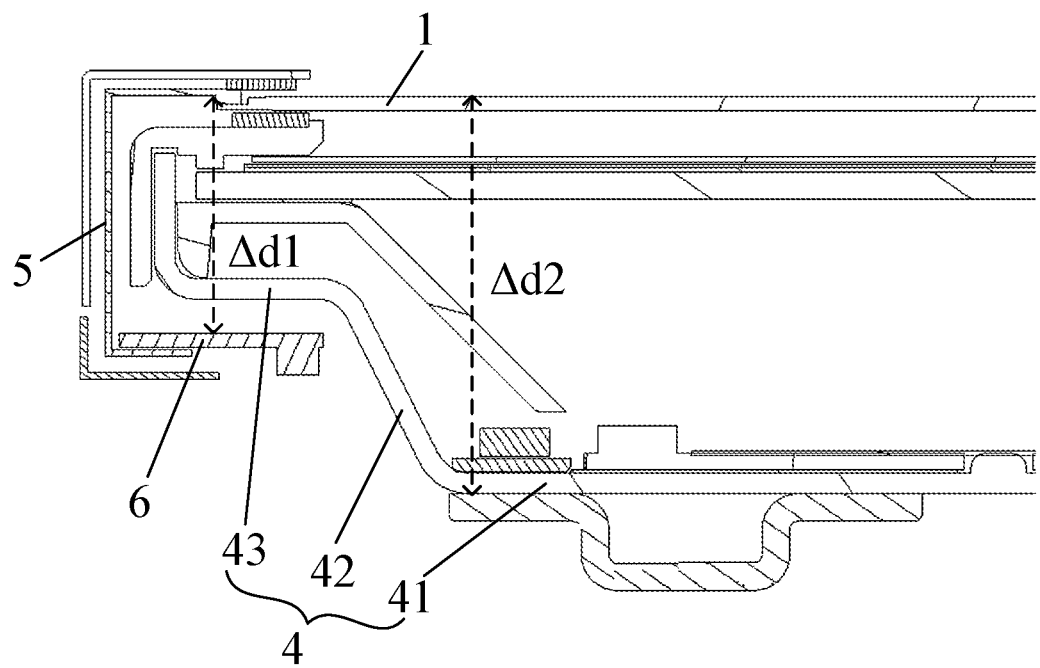
FIG. 8 is a schematic diagram of a partial cross-sectional structure of a curved display module at a first long side provided by an embodiment of the present application.

Specifically, in the curved display module provided by the embodiment of the present application, as shown in FIG. 8, in some embodiments, a first long-side edge of the back plate 4 is in a shape of staircase, and includes a back surface 41, a slope surface 42, and a step surface 43 which are sequentially connected in a direction from a position away from the first long-side edge to a position close to the first long-side edge.

Exemplarily, as shown in FIG. 8, the XPCB 6 is disposed on one side of the first long-side edge of the back plate 4, specifically on the step surface 43 of the back plate 4; and one side of the FPC 5 is connected to the panel 1 and the other side of the FPC 5 is connected to the XPCB 6 on the step surface 43.

Figure 9:
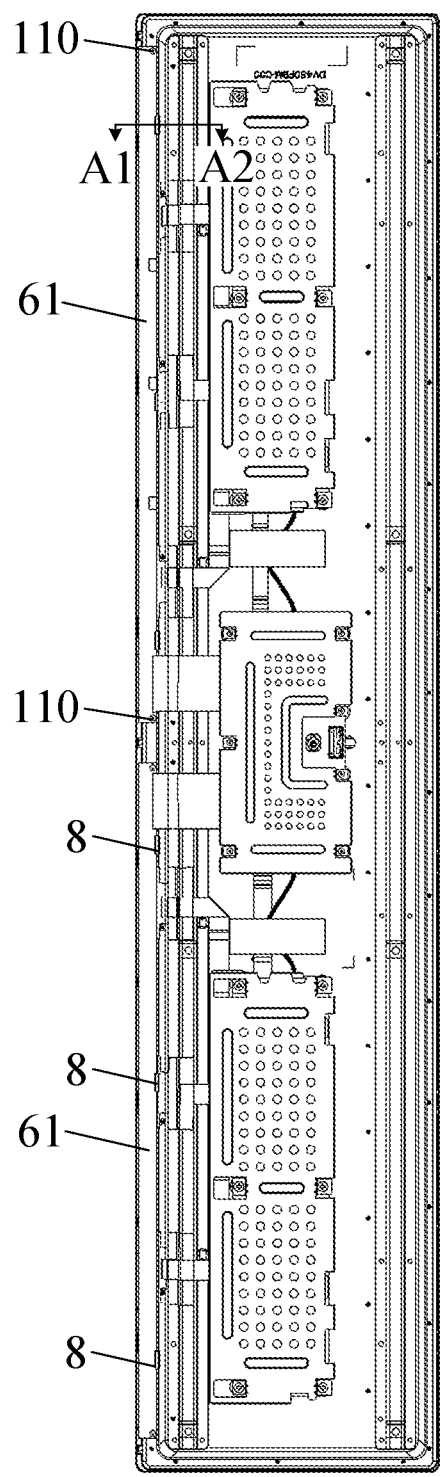
FIG. 9 is a schematic structural diagram of a back surface of a curved display module provided by an embodiment of the present application.

Exemplarily, as shown in FIG. 2 and FIG. 9, the XPCB 6 includes at least two sub XPCBs 61 arranged in an extension direction of the first long side and independent from each other, and each sub XPCB 61 extends along the first long side, and is fixed to the back plate 4 by means of an independent connection member.

Specifically, compared to a conventional display device that sets an XPCB 6 on the back surface 41 of the back plate 4, in the embodiment of the present application, the XPCB 6 is disposed on the step surface 43 of the back plate 4 to reduce the distance $\Delta d$ from the FPC 5 on the panel side to the FPC 5 on the XPCB 6 side, thereby reducing the requirement for the span difference $\Delta L$ of the FPC 5 on the front and back sides during module bending, effectively reducing the risk of tearing of a COF after module assembly, and avoiding the problem of partial black screen of the module. For example, as shown in FIG. 8, $\Delta d1$ is roughly 17.6 mm when the XPCB 6 is placed on the step surface 43 of the back plate 4, and $\Delta d2$ is roughly 28.2 mm when the XPCB 6 is fixed to the back surface 41 of the back plate 4, and the $\Delta d$ value is greatly reduced in comparison, which can reduce the risk of tearing of the FPC 5.

Specifically, in the embodiment of the present application, the XPCB 6 adopts a multi-segment design, and each sub XPCB 61 is fixed to the curved back plate 4 by means of the independent connection member, which may ensure a reliability of the XPCB 6 when the display module vibrates (e.g., the vehicle-mounted display module vibrates during vehicle driving). Moreover, the XPCB 6 is designed as a multi-segment sub XPCB 61 structure, the length of each sub XPCB 61 is smaller, and the total span of the FPC 5 connected to each sub XPCB 61 is smaller, i.e., the total span L PCB of the FPC 5 on the XPCB 6 side is reduced, which in turn may reduce a requirement for changes of the total span difference $\Delta L$ of the FPC 5 during the bending of the XPCB 6, effectively reduce the risk of tearing of the FPC 5 after module assembly, and further avoid the problem of partial black screen of the module.

In some embodiments, as shown in FIG. 2 and FIG. 9, the connection member includes snap fasteners (hook) 8 and screws; the snap fasteners 8 are configured to connect the sub XPCB 61 to the back plate 4; and the screws are configured to lock the sub XPCB 61 to the back plate 4.

Exemplarily, as shown in FIG. 2 and FIG. 9, in the embodiment of the present application, the XPCB 6 adopts a multi-segment design, each sub XPCB 61 is fixed to the curved back plate 4 by the plurality of snap fasteners 8, and the plurality of snap fasteners 8 are sequentially arranged in the extension direction of each sub XPCB 61 to achieve the bending of the XPCB 6 with the back plate 4. In addition, exemplarily, left and right ends of each XPCB 6 may be locked to the step surface of the back plate 4 by the screws 110 to ensure the reliability of the XPCB 6 when the display module vibrates (e.g., the vehicle-mounted display module vibrates during vehicle driving).

Exemplarily, as shown in FIG. 2, each sub XPCB 61 is connected to the bonding region of the display panel 1 by a plurality of FPCs 5, and the plurality of snap fasteners 8 are disposed among the plurality of FPCs 5 at intervals, to avoid interference to the FPCs 5.

Specifically, in the present application, the control for curvature is performed on each sub XPCB 61 by the plurality of snap fasteners 8 to achieve the bending of each sub XPCB 61, and meanwhile, the left and right ends of each sub XPCB 61 are locked with the screws 110 to ensure the reliability of each sub XPCB 61 during the vibration of the module. Thus, curved fixation of the flat XPCB is ensured, and the problem of the XPCB position noise during vehicle driving is also solved.

Exemplarily, the snap fasteners 8 may be made of silicone or PC.

Exemplarily, as shown in FIG. 10 to FIG. 13, a first bayonet is disposed in the step surface 43 of the back plate 4. Each snap fastener 8 includes a clamping portion 81 and a snap portion 82; the clamping portion 81 is a semi-closed or open frame structure and configured to clamp and limit the sub XPCB 61; and the snap portion 82 is connected to the clamping portion 81 and configured to be snapped in the first bayonet of the step surface 43 of the back plate 4.

Figure 11:
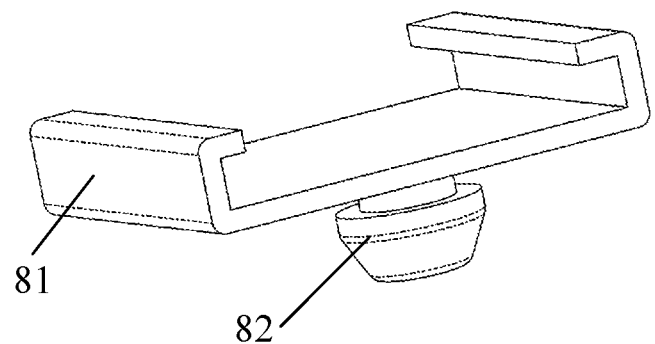
FIG. 11 is a schematic structural diagram of a snap fastener provided by an embodiment of the present application.
Figure 12:
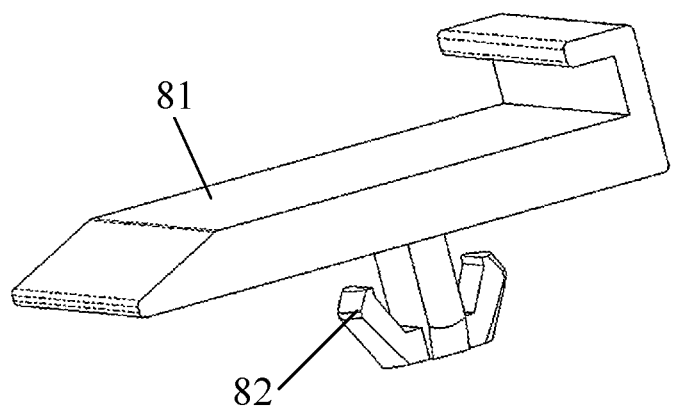
FIG. 12 is a schematic structural diagram of a snap fastener provided by another embodiment of the present application.
Figure 13:
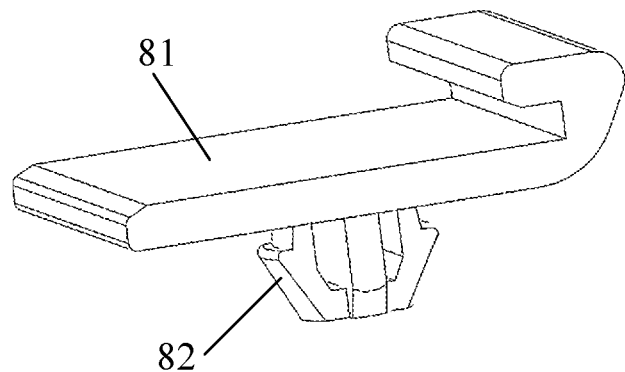
FIG. 13 is a schematic structural diagram of a snap fastener provided by another embodiment of the present application.

Exemplarily, the snap portion 82 is a round table type snap (as shown in FIG. 11) or a claw hook type snap (as shown in FIG. 12 and FIG. 13).

For example, if each snap fastener 8 is made of silicone, the clamping portion 81 may be designed as a semi-closed frame structure, as shown in FIG. 11, that is, a position for clamping the XPCB 6 is designed to be in a semi-closed type, and the semi-closed frame structure has constraints in both a curvature direction and a longitudinal direction for the XPCB 6; the snap portion 82 connected to the back plate 4 may be designed as a round table (mushroom head) or claw hook type snaps; and the snap fastener 8 of the semi-closed structure corresponding to the rubber is more suitable for static use environments such as curved TVs, and curved NBs.

Figure 10:
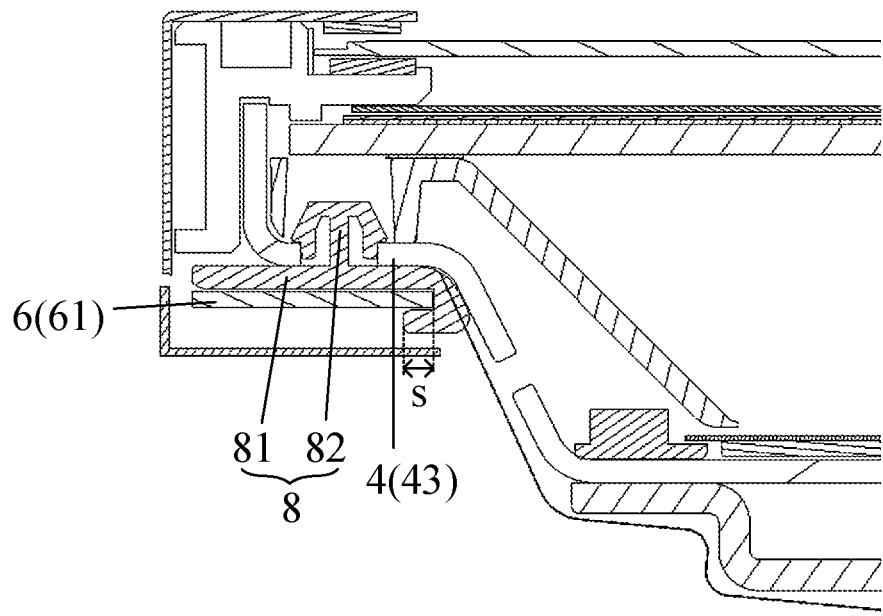
FIG. 10 is a schematic diagram of a cross-sectional structure of a curved display module in an A1-A2 direction in FIG. 9 provided by an embodiment of the present application.

For example, if each snap fastener 8 is made of PC, the clamping portion 81 may be designed as an open frame structure, as shown in FIG. 12 and FIG. 13, that is, the position for clamping the XPCB 6 is designed to be in an open type, the open frame structure only has constraint in the curvature direction for the XPCB 6, and constraint in the longitudinal direction mainly relies on locking of the screws at the left and right ends of the XPCB 6; and the snap portion 82 connected to the back plate 4 cannot be designed to be of a mushroom head structure and only is designed to be a claw hook type snap, but the claw hook type snap may be designed as a pure claw hook snap (as shown in FIG. 12) or a step type claw hook snap (as shown in FIG. 13), both of which can be used in the curved module, but the shaking amount is smaller when the step type claw hook snap is matched with the back plate 4 (as shown in FIG. 10), and vibration noise is smaller, so the step type claw hook snap is more suitable for the vehicle-mounted curved module.

Figure 14:
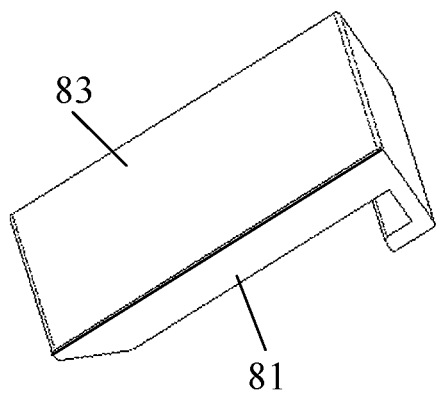
FIG. 14 is a schematic structural diagram of a snap fastener provided by another embodiment of the present application.

Exemplarily, as shown in FIG. 14, the snap fastener 8 may also be set to include a clamping portion 81 and a double-sided adhesive tape 83; the clamping portion 81 is a semi-closed or open frame structure and configured to clamp and limit the sub XPCB 61; and the double-sided adhesive tape 83 is disposed on one side surface of the clamping portion 81 facing away from the sub XPCB and configured to stick to the step surface of the back plate. In other words, the snap portion of the snap fastener for being connected to the back plate may be replaced with the double-sided adhesive tape, by which the snap fastener sticks to the step surface of the back plate. The clamping portion 81 of the snap fastener in this solution may be made of either silicone or PC. However, since the reliability of the double-sided adhesive tape attachment method is not as good as that of the snap portion, this solution is relatively more suitable for static application site products such as the TVs and the NBs.

Specifically, in the present application, as shown in FIG. 10, an overlap between the clamping portion 81 of the snap fastener 8 and the XPCB 6 needs to be reasonably designed, usually depending on the application site. The overlap for TVs, NBs and other items may be slightly smaller, but in vehicle-mounted products, the overlap must be large enough to ensure that the XPCB 6 does not jump out of the clamping portion 81 during use.

For example, in a specific embodiment, in a 6.48-inch vehicle-mounted curved display module, the XPCB is fixed with the snap fasteners made of PC, each sub XPCB is connected to the back plate by five snap fasteners, and the overlap between each snap fastener and the sub XPCB is 1.9 mm; and the snap fasteners and the back plate are matched by step type claw hook snaps, and the step is matched with a back plate assembly hole with zero clearance. The design solves the problem that the sub XPCBs jump out from the snap fasteners during the use of the vehicle-mounted display module (such as during vibration), and also solves the noise problem caused by collision between the snap fasteners and the back plate of the module during the use of a vehicle, and through customer NVH test, this design is approved by customers.

Figure 15:
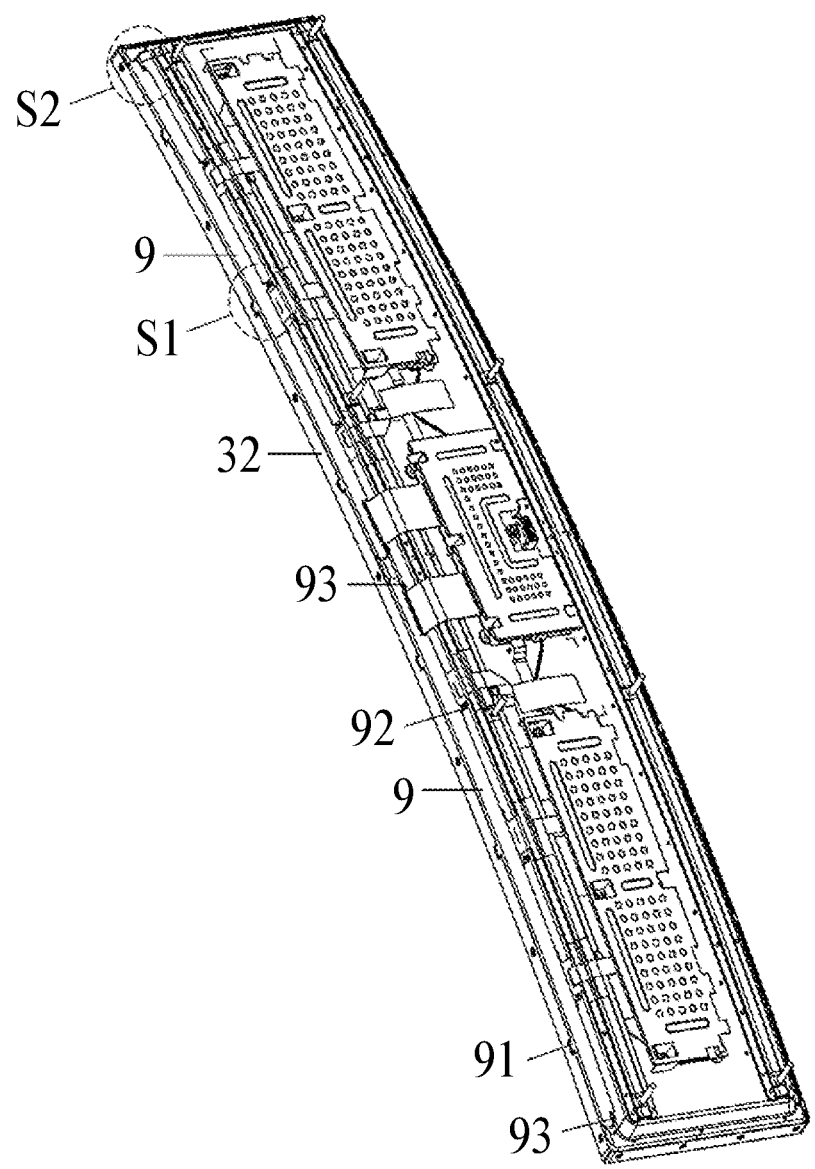
FIG. 15 is a schematic structural diagram of a back surface of a curved display module provided by another embodiment of the present application.

In some embodiments, as shown in FIG. 2 and FIG. 15, the curved display module of the present application further includes cover plates 9 in one-to-one correspondence with the sub XPCBs 61; and each of the cover plates 9 is in a strip shape matched with a shape of the sub XPCB 61, configured to cover the sub XPCB 61 corresponding thereto, and fixedly connected to the back plate 4.

Exemplarily, the XPCB 6 includes two sub XPCBs 61, and the curved display module includes two cover plates 9 in one-to-one correspondence with the two sub XPCBs 61. Each sub XPCB 61 is effectively protected by being located between the back plate 4 and the cover plate 9 corresponding to the sub XPCB 61.

In the module design, all electronic components should be effectively protected, and it should be ensured that the module can pass EMC test. For example, in the curved display module of the present application (e.g., a 48-inch vehicle-mounted curved display module), in order to effectively protect the FPC of the module, the XPCB is designed in two segments and is fixed on the step surface of the back plate, where the space is narrow, and the design of the cover plates configured to protect the XPCB has many restrictions. Through comprehensive evaluation, the final confirmed design solution is: as shown in FIG. 2 and FIG. 15, each sub XPCB 61 is protected by an independent cover plate 9, and the two sub XPCBs 61 board and the cover plates 9 thereof are disposed symmetrically left and right.

Figure 16:
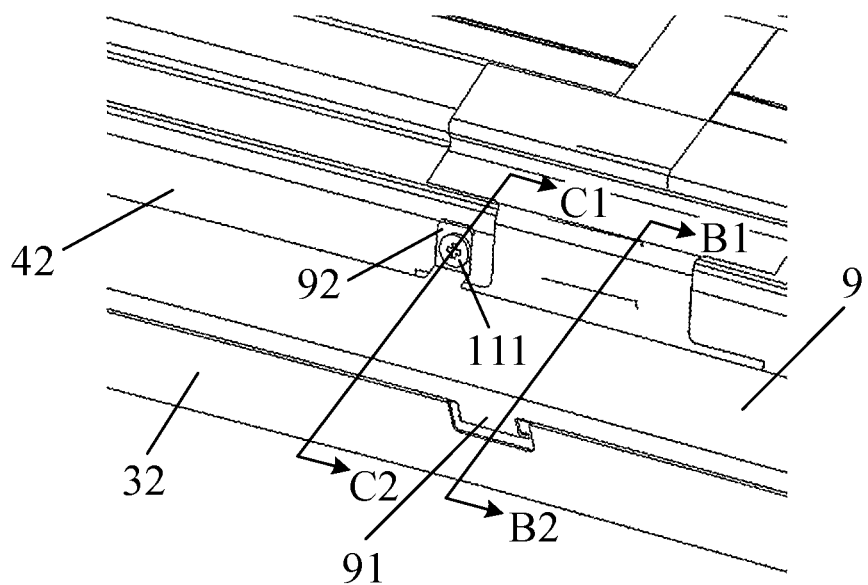
FIG. 16 is a schematic diagram of an enlarged structure of an S1 part of the curved display module in FIG. 15.
Figure 17:
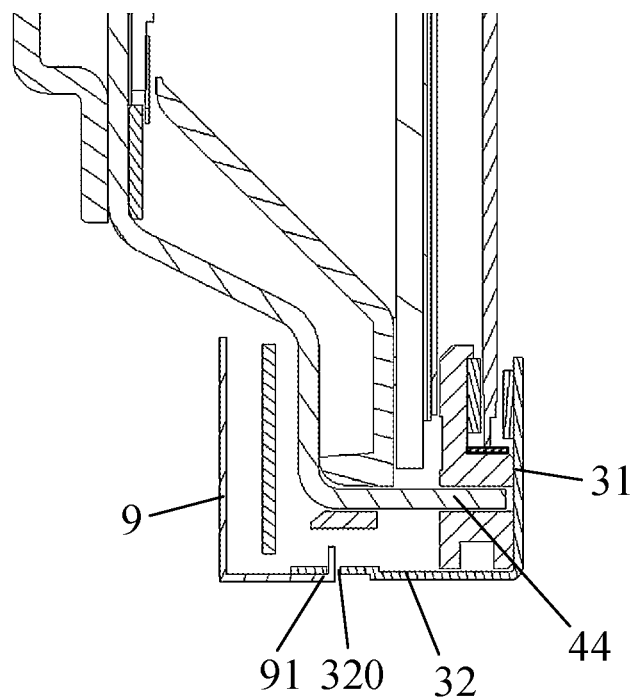
FIG. 17 is a schematic diagram of a cross-sectional structure of the curved display module in a B1-B2 direction in FIG. 16.

Specifically, as shown in FIG. 15 to FIG. 17, the front frame includes a front bezel 31 and a side bezel 32, and the side bezel 32 wraps around an outer side of a folded edge 44 of the back plate and is fixedly connected to the folded edge 44 of the back plate.

In some embodiments, as shown in FIG. 15 to FIG. 17, a second bayonet 320 is disposed on a section of the side bezel 32 disposed along the first long side of the display panel. Exemplarily, a hook portion 91 is disposed on a side edge of each cover plate 9 close to the section of the side bezel 32, and the hook portion 91 is clamped with the second bayonet 320 on the section of the side bezel 32.

Figure 18:
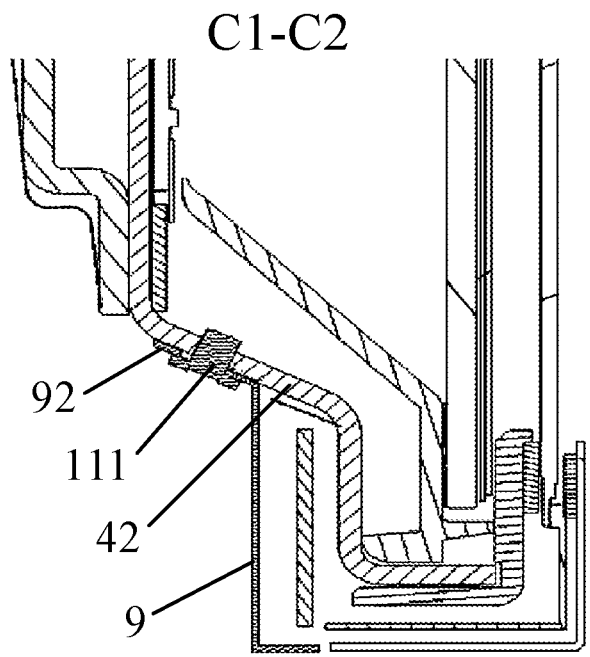
FIG. 18 is a schematic diagram of a cross-sectional structure of the curved display module in a C1-C2 direction in FIG. 16.

Furthermore, as shown in FIG. 15, FIG. 16 and FIG. 18, a first locking nail portion 92 is disposed on a side edge of each cover plate 9 away from the section of the side bezel 32 and has a first locking nail hole; and the first locking nail portion 92 is disposed on the slope surface 42 of the back plate and connected to the slope surface 42 of the back plate by a screw.

Figure 19:
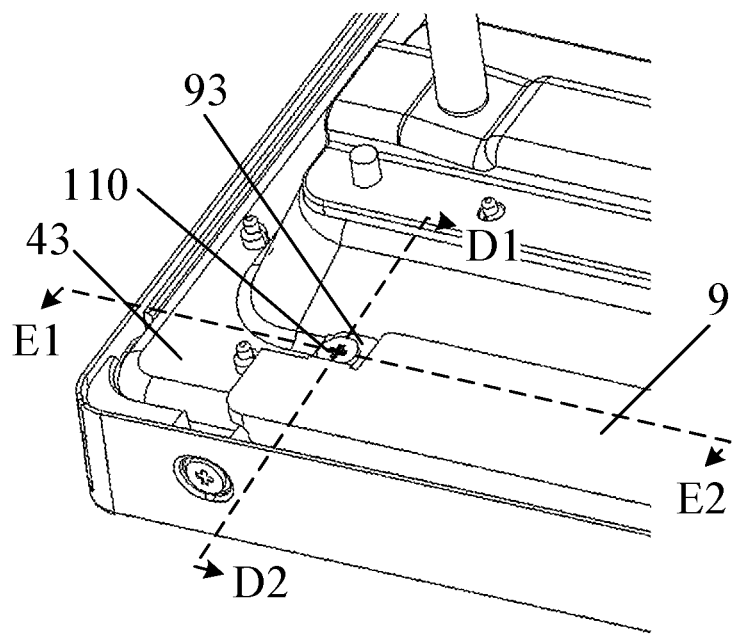
FIG. 19 is a schematic diagram of an enlarged structure of an S2 part of the curved display module in FIG. 15.
Figure 20:
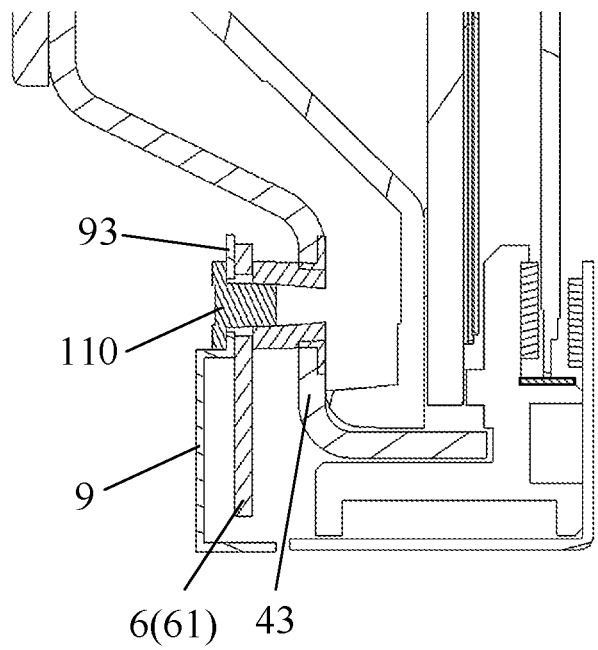
FIG. 20 is a schematic diagram of a cross-sectional structure of the curved display module in a D1-D2 direction in FIG. 19.

Furthermore, as shown in FIG. 15, FIG. 19, FIG. 20 and FIG. 21, second locking nail portions 93 are disposed at two ends of each cover plate 9 and have second locking nail holes; and the second locking nail portions 93 are disposed on the step surface 43 of the back plate and connected to the step surface 43 by screws 110. Exemplarily, as shown in FIG. 20, the second locking nail holes provided in the second locking nail portions 93 are waist-shaped holes extending in the extension direction of the first long side, which can be well compatible with the assembly tolerance caused by the curvature deformation of the display module.

Exemplarily, as shown in FIG. 15, each cover plate 9 includes a plurality of hook portions 91 and a plurality of first locking nail portions 92; the plurality of hook portions 91 are sequentially arranged along the side edge of the cover plate 9 close to the side bezel 32; and the plurality of first locking nail portions 92 are sequentially arranged along the side edge of the cover plate 9 away from the side bezel 32.

Figure 22:
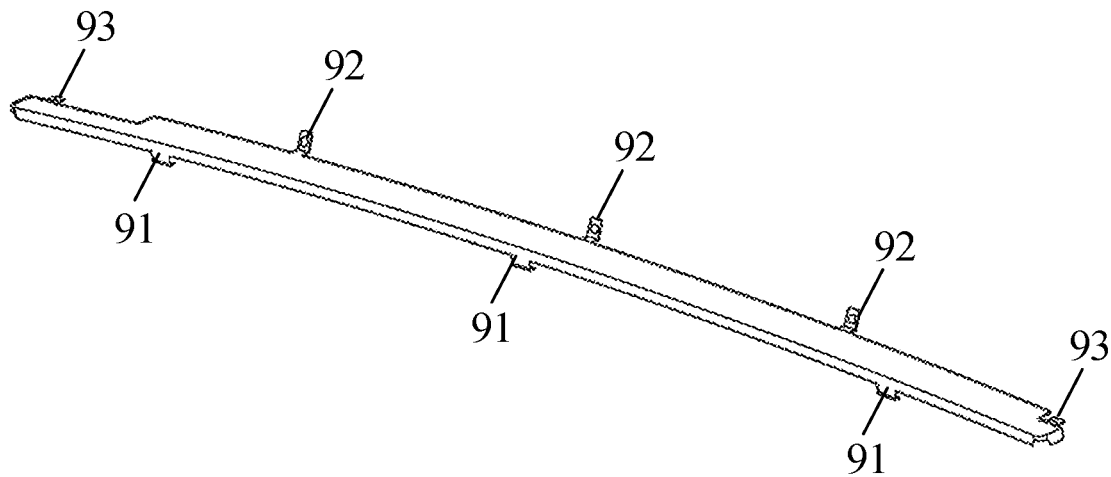
FIG. 22 is a schematic structural diagram of a cover plate provided by an embodiment of the present application.

In the embodiment of the present application, in order to ensure the curvature of the cover plate 9 and the reliability of fixation, the cover plate 9 is fixed from three aspects: the hook portions 91 extending from a long side of one side, the first locking nail portion 92 extending from the long side of the other side to the slope surface 42 of the back plate 4, and the second locking nail portions 93 disposed at two ends. As shown in FIG. 2, FIG. 15 and FIG. 22, for example, each cover plate 9 may have three hook portions 91, and through the three hook portions 91 matched with the side bezel 32 of the front frame 3 in a snap mode, the snap overlap may be about 2.0 mm. This design has a simple structure, saves space, and is firmly and reliably assembled; and each cover plate 9 has two second locking nail portions 93, and the two second locking nail portions 93 are respectively located at two ends of the cover plate 9 and are locked on the back plate 4 through the screws 110. For example, second locking nail holes of the second locking nail portions 93 may be waist-shaped holes matched with M2.5 threaded holes in the step surface of the back plate 4, with a hole diameter of Ø3.0 mm and a circle distance of 1.0 mm, and the design of the waist-shaped holes at both ends can be well compatible with the assembly tolerance caused by the curvature deformation in the curved module. Each cover plate 9 has three first locking nail portions 92 which are locked on the back plate 4 through screws 111, for example, first locking nail holes provided in the first locking nail portions 92 may be round holes matched with M2.5 threaded hole in the slope surface of the back plate 4, with a hole diameter of Ø3.5 mm, and the Ø3.5 mm hole diameter can be well compatible with the left and right deviation from the threaded holes of the step surface and the up and down deviation from the threaded holes of the slope surface in the assembly process relative to the Ø2.5 mm screws. Through this structure, the cover plate 9 and the slope surface of the back plate 4 are locked together, which means that the possible curvature deformation of the curved structure is corrected and the assembly curvature of the cover plate 9 is ensured, and the outward warping of the cover plate 9 during the assembly and transportation can also be avoided. The design of the cover plates 9 of the embodiment of the present application can simultaneously ensure the EMC performance at the XPCB 6 and the overall appearance of the curved display module, and can effectively control the gap between the cover plates 9 and a main structure of the module to ensure no noise in the practical process.

Figure 21:
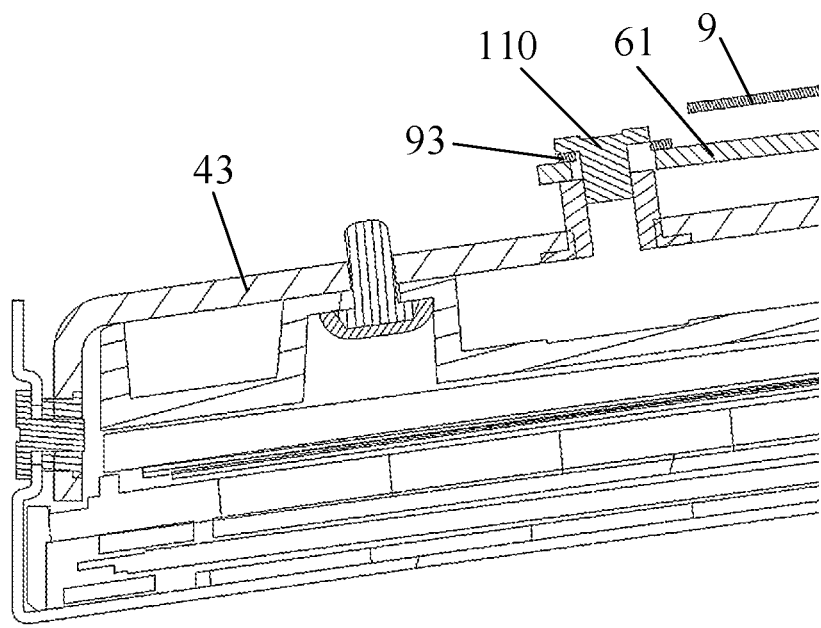
FIG. 21 is a schematic diagram of a cross-sectional structure of the curved display module in an E1-E2 direction in FIG. 19.
Figure 23:
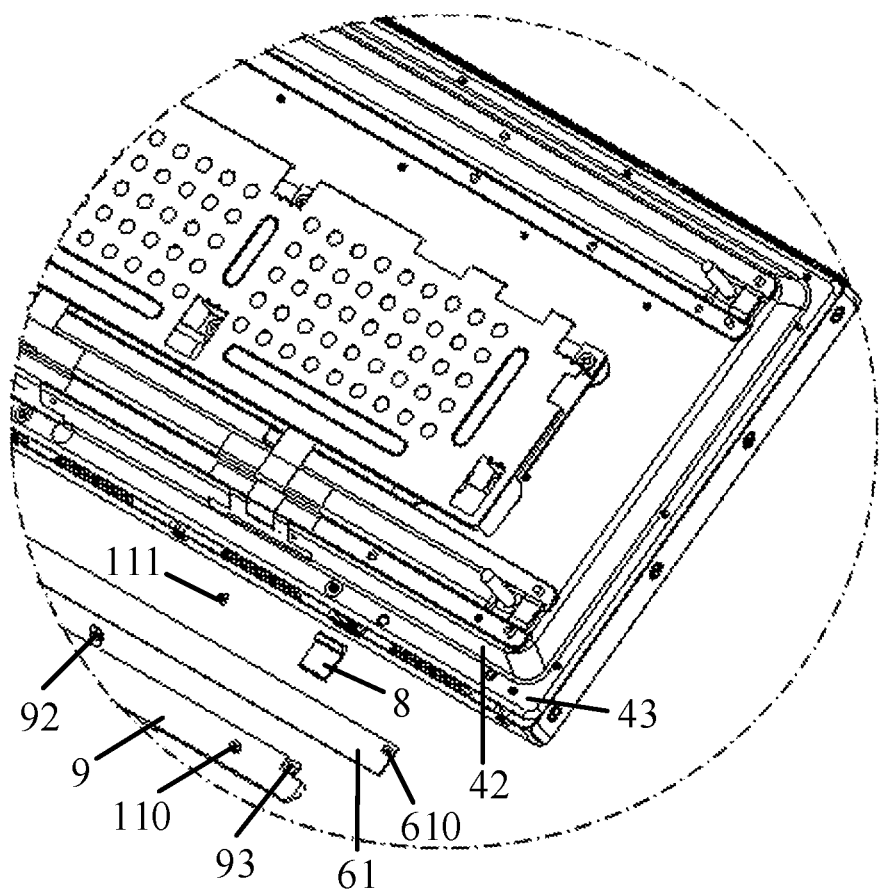
FIG. 23 is a schematic diagram of a partial exploded structure of a curved display module before a sub XPCB is assembled provided by an embodiment of the present application.
Figure 24:
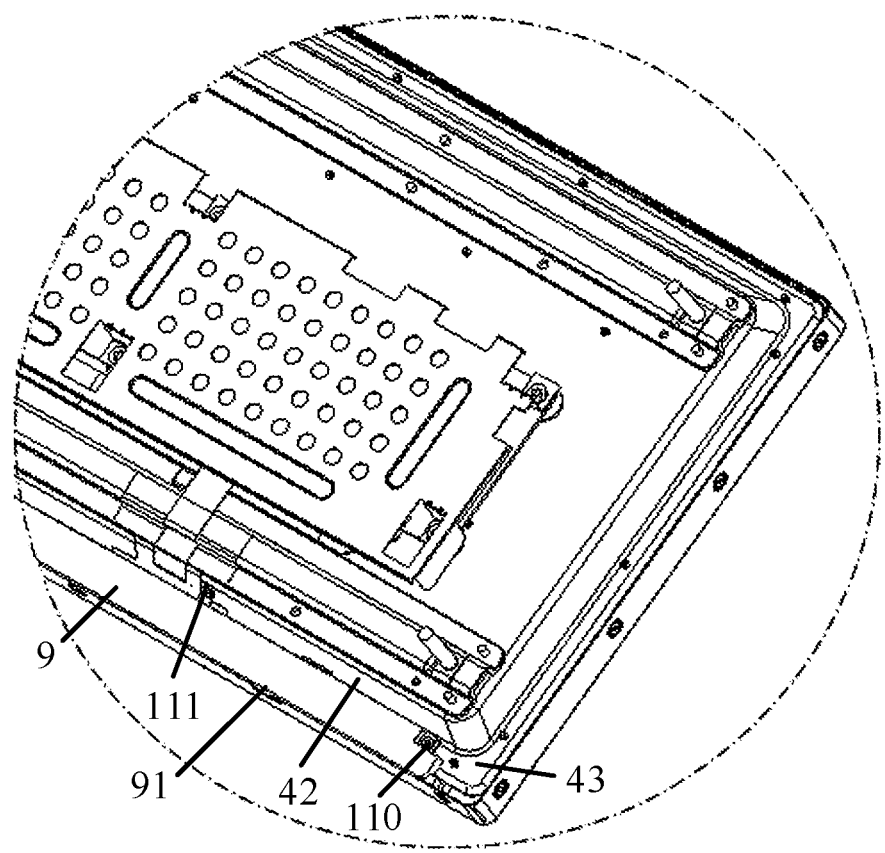
FIG. 24 is a schematic diagram of a partial structure of a curved display module after a sub XPCB is assembled in FIG. 23.

Exemplarily, as shown in FIG. 19 to FIG. 21, and in FIG. 23 and FIG. 24, the sub XPCB 61 has third locking nail holes 610 corresponding to the second locking nail holes provided in the second locking nail portions 93 in position; the third locking nail holes 610 are waist-shaped holes extending in the extension direction of the first long side; and the screws 110 connecting the second locking nail portions 93 to the step surface 43 of the back plate penetrate through the third locking nail holes 610, that is, the locking screws 110 at both ends of the cover plate 9 lock both ends of the sub XPCB 61, or rather, both ends of the cover plate 9 and both ends of the sub XPCB 61 corresponding thereto are simultaneously locked to the step surface 43 of the back plate 4 by means of the same screws 110. For example, as shown in FIG. 23 and FIG. 24, in the assembly process of the sub XPCB 61 and the cover plate 9, the sub XPCB 61 is first connected to the step surface 43 of the back plate by the plurality of snap fasteners 8, and then the cover plate 9 covers the sub XPCB 61, so that the hook portions 91 are clamped on the side bezel 32 of the front frame, and finally both ends of the cover plate 9 and both ends of the sub XPCB 61 are fixed to the step surface 43 of the back plate by the screws 110, and the first locking nail portions 92 of the cover plate 9 is fixed to the slope surface 42 of the back plate by the screws 111, thereby completing the assembly, and the assembly is shown in FIG. 24.

Specifically, an embodiment of the present application further provides a curved display device, including the curved display module as described according to any one of the above.

Exemplarily, the curved display device may be a vehicle-mounted display product, or a static application place product such as a TV and an NB.

It should be noted that in some embodiments of the present disclosure, the curved display module and device may also include other structures, which may depend on the actual needs, and not limited by the embodiments of the present disclosure. In addition, in the curved display module provided according to the embodiment of the present disclosure, the specific shapes, layouts and sizes of some structures (such as snap fasteners, cover plates 9, a silicone pad 103, and foams) are not limited to the embodiments given above, but may also have other improvements in practical applications, which can be found in the description of the functional requirements of each structure above and will not be repeated here.

Apparently, those skilled in the art can make various modifications and variations to the embodiments of the present application without departing from the spirit and scope of the present application. Under the condition that these modifications and variations of the present application fall within the scope of the claims of the present application and their equivalent technologies, the present application is also intended to include these modifications and variations.

What is claimed is:

1. A curved display module, capable of being bent in a long-side direction, and comprising a display panel, a backlight module, a front frame, a back plate, an X-printed circuit board (XPCB) and a flexible printed circuit (FPC), wherein the front frame and the back plate are matched to assemble the display panel and the backlight module; wherein the FPC is at a first long-side edge of the display panel and is configured to connect a bonding region of the first long-side edge of the display panel to the XPCB;

a first long-side edge of the back plate is in a shape of staircase, and comprises a back surface, a slope surface, and a step surface which are sequentially connected in a direction from a position away from the first long-side edge to a position close to the first long-side edge; and the XPCB is on the step surface of the back plate, and comprises at least two sub XPCBs arranged in an extension direction of a first long side and independent from each other, and each of the sub XPCBs extends along the first long side, and is fixed to the back plate by means of a connection member which is independent;

wherein the curved display module further comprises cover plates in one-to-one correspondence with the sub XPCBs, wherein each of the cover plates is in a strip shape matched with a shape of the sub XPCB, configured to cover the sub XPCB corresponding thereto, and fixedly connected to the back plate;

wherein the front frame comprises a front bezel and a side bezel, and the side bezel wraps around an outer side of a folded edge of the back plate and is fixedly connected to the folded edge of the back plate; and a second bayonet is disposed on a section of the side bezel disposed along the first long side of the display panel; and a hook portion is disposed on a side edge of each of the cover plates close to the side bezel, and the hook portion is clamped with the second bayonet on the side bezel;

wherein a first locking nail portion is disposed on a side edge of each of the cover plates away from the side bezel, disposed on the slope surface of the back plate and connected to the slope surface by a screw.

2. The curved display module according to claim 1, wherein the connection member comprises snap fasteners and screws; the snap fasteners are configured to connect the sub XPCB to the back plate; and the screws are configured to lock the sub XPCB to the back plate.

3. The curved display module according to claim 2, wherein each of the sub XPCBs is connected to the back plate by a plurality of snap fasteners, and the plurality of snap fasteners are arranged sequentially in an extension direction of the sub XPCB.

4. The curved display module according to claim 3, wherein each of the sub XPCBs is connected to the bonding region of the display panel by a plurality of FPCs, and the plurality of snap fasteners are disposed among the plurality of FPCs at intervals.

5. The curved display module according to claim 3, wherein two ends of each of the sub XPCBs are locked to the step surface of the back plate by the screws.

6. The curved display module according to claim 2, wherein a first bayonet is disposed in the step surface of the back plate; and each of the snap fasteners comprises a clamping portion and a snap portion; the clamping portion is a semi-closed or open frame structure and configured to clamp and limit the sub XPCB; and the snap portion is connected to the clamping portion and configured to be snapped in the first bayonet of the step surface of the back plate.

7. The curved display module according to claim 6, wherein the snap portion is a claw hook type snap or a round table type snap.

8. The curved display module according to claim 2, wherein the snap fastener comprises a clamping portion and a double-sided adhesive tape; the clamping portion is a semi-closed or open frame structure and configured to clamp and limit the sub XPCB; and the double-sided adhesive tape is disposed on a side surface of the clamping portion facing away from the sub XPCB and configured to stick to the step surface of the back plate.

9. The curved display module according to claim 1, wherein second locking nail portions are disposed at two ends of each of the cover plates, disposed on the step surface of the back plate and connected to the step surface by screws; and second locking nail holes formed in the second locking nail portions are waist-shaped holes extending in the extension direction of the first long side.

10. The curved display module according to claim 9, wherein each of the sub XPCBs has a third locking nail hole corresponding to each of the second locking nail holes in position; the third locking nail hole is a waist-shaped hole extending in the extension direction of the first long side; and the screw connecting the second locking nail portion to the step surface of the back plate penetrate through the third locking nail hole.

11. The curved display module according to claim 1, wherein each of the cover plate comprise a plurality of hook portions and a plurality of first locking nail portions; the plurality of hook portions are sequentially arranged along the side edge of the cover plate close to the side bezel; and the plurality of first locking nail portions are sequentially arranged along the side edge of the cover plate away from the side bezel.

12. The curved display module according to claim 1, wherein the XPCB comprises two sub XPCBs, and the curved display module comprises two cover plates in one-to-one correspondence with the two sub XPCBs.

13. The curved display module according to claim 1, further comprising an upper adhesive frame, wherein the upper adhesive frame comprises a longitudinal frame configured to limit side edges of the display panel and a bearing portion extending inward relative to the longitudinal frame and configured to bear a back edge of the display panel;

the front frame comprises a front bezel and a side bezel, and the front bezel is configured to limit a front edge of the display panel; and the curved display module further comprises a first foam between the front bezel and the front edge of the display panel, a second foam between the bearing portion of the upper adhesive frame and the back edge of the display panel, and a silicone pad between the longitudinal frame of the upper adhesive frame and the side edges of the display panel.

14. A curved display device, comprising the curved display module according to claim 1.

* * * * *